US010768224B2

(12) United States Patent
Ramsay et al.

(10) Patent No.: US 10,768,224 B2
(45) Date of Patent: Sep. 8, 2020

(54) HIGH FREQUENCY LOCK-IN THERMOGRAPHY USING SINGLE PHOTON DETECTORS

(71) Applicant: FEI Company, Hillsboro, OR (US)

(72) Inventors: Euan Ramsay, Dublin, CA (US); Theodore R. Lundquist, Milpitas, CA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/390,096

(22) Filed: Dec. 23, 2016

(65) Prior Publication Data

US 2018/0180670 A1 Jun. 28, 2018

(51) Int. Cl.
*G01R 31/308* (2006.01)
*G01J 5/00* (2006.01)
*G01R 31/311* (2006.01)
*H02S 50/15* (2014.01)
*G01N 25/72* (2006.01)

(52) U.S. Cl.
CPC .......... *G01R 31/308* (2013.01); *G01J 5/0096* (2013.01); *G01N 25/72* (2013.01); *G01R 31/311* (2013.01); *H02S 50/15* (2014.12)

(58) Field of Classification Search
CPC ....... G01R 31/308; G01R 1/07; G01J 5/0096; G01J 2005/0081
See application file for complete search history.

(56) References Cited

U.S. PATENT DOCUMENTS

| | | | | |
|---|---|---|---|---|
| 6,353,324 B1* | 3/2002 | Uber | ................. | G01R 19/2509 324/457 |
| 6,943,578 B1* | 9/2005 | Sanda | ................. | G01R 31/308 324/762.02 |
| 9,596,421 B1* | 3/2017 | Itzler | ......................... | G01J 1/44 |
| 2005/0002028 A1* | 1/2005 | Kasapi | ................. | G01R 31/311 356/328 |
| 2005/0094706 A1* | 5/2005 | Guha | ....................... | G01J 5/00 374/137 |

(Continued)

OTHER PUBLICATIONS

"Product Information Sheet: ThermoSpector—Lock-In Thermography for Solar Cells and Modules," ThermoSensorik GmbH, 4 pages (2009).

*Primary Examiner* — Akm Zakaria
(74) *Attorney, Agent, or Firm* — Klarquist Sparkman, LLP

(57) ABSTRACT

Systems, methods, and computer readable media to improve the operation of thermographic imaging systems are described. Techniques are disclosed for generating thermograms using single low-noise photon detectors. More particularly, an array of single low-noise photon detectors operating in the Geiger mode may be used to accurately identify the time delay between the application of a periodic power stimulus to a device under test and the generation of photons resulting from that stimulus. In one embodiment an array of single photon detectors may be used to time-tag each detected photon. Thereafter, a high-speed counting circuit can correlate the detected photons to the applied stimulus. When operating at the frequencies possible in the Geiger mode, such measurements permit a higher degree of spatial resolution (e.g., in the x, y and z axes) of thermal hot-spots within the device under test than prior art approaches.

24 Claims, 3 Drawing Sheets

(56) References Cited

U.S. PATENT DOCUMENTS

| | | | | |
|---|---|---|---|---|
| 2006/0103378 A1* | 5/2006 | Pakdaman | ............ | G01R 31/311 |
| | | | | 324/228 |
| 2011/0280468 A1* | 11/2011 | Song | .................... | G01R 31/311 |
| | | | | 382/147 |
| 2012/0327287 A1* | 12/2012 | Meyers | .................. | G01B 11/24 |
| | | | | 348/335 |
| 2013/0314116 A1* | 11/2013 | Vedagarbha | ......... | G01R 31/311 |
| | | | | 324/754.23 |
| 2015/0300882 A1* | 10/2015 | Falk | ..................... | G01R 31/311 |
| | | | | 324/754.21 |
| 2016/0139266 A1* | 5/2016 | Montoya | ................. | G01S 17/32 |
| | | | | 356/5.01 |

* cited by examiner

HIGH FREQUENCY LOCK-IN THERMOGRAPHY USING SINGLE PHOTON DETECTORS

BACKGROUND

This disclosure relates generally to thermographic inspection. More particularly, but not by way of limitation, this disclosure relates to high-frequency lock-in thermography using single photon detectors.

Thermography is a nondestructive, nonintrusive, noncontact mapping of thermal patterns or "thermograms," on the surface of objects through the use of some type of infrared (IR) detector. The principle of lock-in thermography (LIT) consists of introducing periodically modulated energy (e.g., electrical impulses) into an object (e.g., solar cells, integrated circuits, and stacked die geometries) and monitoring the periodic (relative) surface temperature coincident with application of the input energy. One application of LIT technology is the characterization of shunts in solar cells. Shunts are sites of locally increased forward current density. Since a solar cell is forward biased in operation, any shunt current reduces the efficiency of the solar cell. Shunts may be caused by electrical defects of the pn-junction, which may be generated by lattice defects, as well as by technological imperfections of the production process. Another application of LIT technology is the functional testing of electronic devices like integrated circuits. Large differences in the IR emissivity between metalized pathways (i.e., metallizations) and bare silicon layers allows identification and localization of circuit defects. Yet another application of LIT is the localization of gate oxide integrity (GOI) defects in Czochralski-grown silicon metal-oxide semiconductor (MOS) structures. Gate oxide integrity defects are local sites of reduced breakdown voltage. Once defects are identified and localized by LIT, additional microscopic and analytical investigations may be used to clarify the nature of the defects and to find ways to avoid them.

SUMMARY

In one embodiment the disclosed concepts include a system to determine defects in a device under test (DUT) through lock-in thermography (LIT) operations. In one embodiment such a device includes an excitation source configured to supply power at a reference frequency; a defect detection circuit (configured to detect individual photons generated by the DUT in response to receiving input from the excitation source, associate a timestamp with at least some of the detected photons, and determine a time difference for each of the detected photons based on the photon's corresponding timestamp and a time associated with the excitation source); and an output module configured to generate one or more images based on the detected photons. In one or more embodiments, the defect detection circuit includes one or more arrays of single photodiodes operating in a Geiger mode (e.g., the photodiodes may include superconducting single-photon detectors). In another embodiment, the defect detection circuit may be configured to determine a time difference for each of the detected photons based on the photon's corresponding timestamp and a time associated with the excitation source for a given excitation period of the excitation source (e.g., a rising edge of the excitation source's signal). In yet another embodiment, the defect detection circuit may be further configured to generate a histogram for each excitation source period, each histogram corresponding to a plurality of determined photon time differences. In still another embodiment, the system may further include a lock-in circuit configured to receive output from the defect detection circuit; receive a reference frequency output from the excitation source; and generate a synchronized input to the output module.

In one embodiment an LIT operation in accordance with one or more embodiments may begin when a stimulation signal (i.e., power) is applied to a device. Photons resulting from the stimulation may then be captured by a detector that includes a number (e.g., an array) of single low-noise photon detectors operating in a Geiger mode (e.g., avalanche photodiodes, nanowire detectors, and superconducting single-photon detectors). On reception, each photon may be associated with a timestamp representing the time the particular photon was detected. Signals indicative of the time each photon was detected may then be used to determine a time difference ($\Delta T$) between when the device was stimulated and when the photon was detected. In one embodiment, the $\Delta T$ values may be binned or collected over a specified time (e.g., a stimulation cycle) to generate histograms indicative of the time spread over which photons are received for a given excitation cycle. The $\Delta T$ values may be used to identify an x-y-z location within the device from which a photon originated. Such information may be used to identify a layer within the device at which a malfunction can be found. In other embodiments, the disclosed methods may be embodied in computer executable program code and stored in a non-transitory storage device.

DETAILED DESCRIPTION

This disclosure pertains to systems, methods, and computer readable media to improve the operation of thermographic imaging systems. In general, techniques are disclosed for generating thermograms using single low-noise photon detectors. More particularly, an array of single low-noise photon detectors operating in avalanche or Geiger mode may be used to accurately identify the time delay between the application of a periodic power stimulus to a circuit or, more generally, a device under test and the generation of photons resulting from that stimulus (e.g., single-photon detectors such as avalanche photodiodes, nanowire detectors, and superconducting single-photon detectors, SSPD). In one embodiment an array of single photon detectors may be used to effectively time-tag each detected photon. Thereafter, a high-speed counting circuit can correlate the detected photons to the applied stimulus. When operating at the frequencies possible in a Geiger mode, such measurements may permit a higher degree of spatial resolution in the z-axis or depth (e.g., on the micron scale) of thermal hot-spots within the device under test than prior art approaches.

In the following description, for purposes of explanation, numerous specific details are set forth in order to provide a thorough understanding of the disclosed concepts. As part of this description, some of this disclosure's drawings represent structures and devices in block diagram form in order to avoid obscuring the novel aspects of the disclosed concepts. In the interest of clarity, not all features of an actual implementation may be described. Moreover, the language used in this disclosure has been principally selected for readability and instructional purposes, and may not have been selected to delineate or circumscribe the inventive subject matter, resort to the claims being necessary to determine such inventive subject matter. Reference in this disclosure to "one embodiment" or to "an embodiment" means that a particular feature, structure, or characteristic described in connection with the embodiment is included in at least one embodiment of the disclosed subject matter, and multiple references to "one embodiment" or "an embodiment" should not be understood as necessarily all referring to the same embodiment.

It will be appreciated that in the development of any actual implementation (as in any software and/or hardware development project), numerous decisions must be made to achieve a developers' specific goals (e.g., compliance with system- and business-related constraints), and that these goals may vary from one implementation to another. It will also be appreciated that such development efforts might be complex and time-consuming, but would nevertheless be a routine undertaking for those of ordinary skill in the field of lock-in thermography system design having the benefit of this disclosure.

Figure 1:
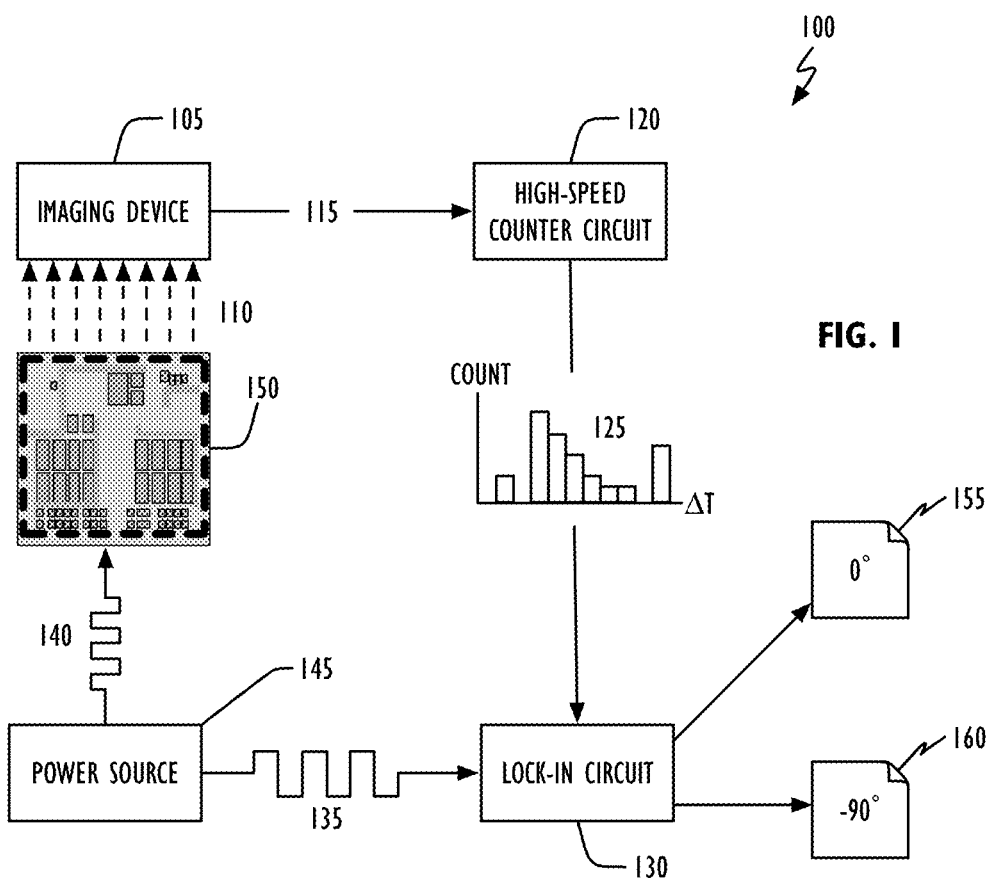
FIG. 1 shows, in block diagram form, a lock-in thermography system in accordance with one or more embodiments.

Referring to FIG. 1, lock-in thermography (LIT) system 100 in accordance with one or more embodiments implements imaging device 105 as an array of single low-noise photon detectors operating in the Geiger mode (e.g., single-photon detectors such as avalanche photodiodes, nanowire detectors, and superconducting single-photon detectors, SSPD). In this mode, the detectors may be driven to collect and transfer much faster than prior art detectors (e.g., in the 100's of MHz). This, in turn, permits the localization of thermal hot-spots to a much finer degree than the prior art—on the order of microns to 10s of microns (e.g., in x, y and z axes). Single photon detector imaging device 105 may detect the arrival of individual thermal photons 110 (e.g., in the approximately 2 to 5 micrometer wavelength range). In one embodiment, imaging device 105 may timestamp each received photon such that signals 115 are indicative of the time that the imaging device 105 receives each photon from device under test (DUT) 150. In one embodiment, high-speed counter circuit 120 may determine the time difference ($\Delta T$) between excitation signal 140 (e.g., a rising edge of excitation signal 140) and photon arrival at imaging device 105 for each stimulation cycle. In one embodiment, pulsed power signal 140 may consist of a specified series of pulses that last, in time, on the order of a few to a few 10s of milliseconds. In another embodiment, high-speed counter circuit 120 may generate histograms 125 (e.g., showing photon count versus $\Delta T$) which may in turn be further sorted by video-based lock-in detector 130, driven by reference frequency 135 that is matched to the stimulation source frequency 140 from power source 345 driving DUT 150. In general, the frequency reference may come from the lock-in circuit 130 or a tester/power source driving the signal (e.g., power source 145), or from another source to which all of these circuits are referenced. Further sorting could, for instance, permit review of only parts of a test cycle. This, in turn, could enable further probing or localization of an observed anomaly (see below). By way of example, each detector pixel (e.g., SSPD) in imaging device 105 could have an associated buffer in high-speed counter circuit 120 which updates every time it receives an input representing a time-stamped photon and the accumulated counts output to a read-out integrated circuit (ROIC) and then to lock-in circuit 130. In one embodiment a photon's arrival time at imaging device 105 may be interpreted as, or is indicative of, the depth from within DUT 150 that a thermal pulse that generated the photon (at the DUT's surface) started. The faster the imaging device, the faster the stimulation frequency can be. The higher the stimulation frequency, the lower the lateral thermal diffusion of the heat source through conduction and hence the better the obtainable lateral resolution (i.e., in the x-y plane). This can also lead to improvement in depth resolution (i.e., along the z axis), as the heat source does not lead to extended emission in the z direction through, for example, reflection of the heat propagation or scatter from other device features within the DUT. The stimulation frequency needed to do this cannot be detected using prior art integrating sensors. To be clear, systems and methods in accordance with this disclosure are not directed toward the generation and capture of "ballistic" photons (i.e., photons generated directly by an element within DUT 150). Rather, the described techniques are directed to the generation and measurement of thermal photons. The generation, detection and measurement of ballistic photons are irrelevant to the generation, detection and measurement of thermal photons as described herein.

Figure 2:
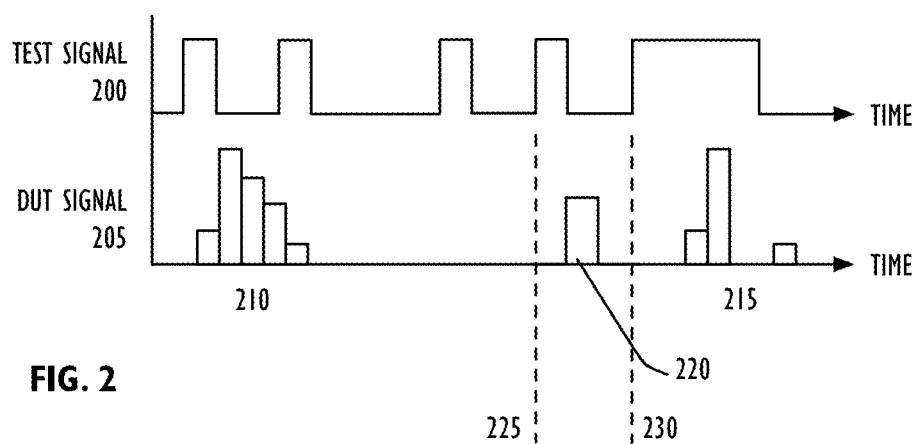
FIG. 2 shows an illustrative test signal and corresponding device under test response signal in accordance with one or more embodiments.

Referring to FIG. 2, in one embodiment test signal 200 (e.g., pulsed power signal 140) may be applied to DUT 150 with DUT signal 205 (e.g., 125) being measured by high-speed counter circuit 120. If 210 and 215 represent expected or "good" DUT responses and 220 an unexpected or "bad" DUT response, imaging device 105 could be synchronized to a phase shifted power signal 140. In other words, imaging device 105 and high-speed counter 120 may be synchronized to a portion of DUT signal 205. By way of example, gating signals applied at times 225 and 230 may be applied to imaging device 105 so as to enable capture of only that portion of DUT signal 205 corresponding to anomalous response 220. Gating signals may be used in this matter to permit the time integration of DUT signal 205 over regions of the test loop that are shorter than the entire test loop. This particular feature may be of particular use when emission from another region of DUT 150 overwhelms the detector. Each photon that arrives at a detector pixel (e.g., a pixel of imaging device 105) should have an associated the X-Y location as defined by the pixel and may be time-stamped. Histograms of arrival time can be generated (e.g., histogram 125), which (to the limits of the detector's jitter) lead to a record indicative of the depth from within DUT 150 the captured photon corresponds. It should be understood that in practice, stimulation signal 140 can cause a thermal hot-spot within DUT 150 which, in turn, causes a thermal pulse to move away from the hot-spot. When this thermal pulse reaches the DUT's surface a photon is generated. It is this photon which imaging device 105 captures. As such, the measured photon's capture time is a function of the material properties of the underlying DUT and its concomitant packaging. Accordingly, some foreknowledge of the thermal conductivity and emissivity of the components within the DUT is needed to correlate the depth of a hot-spot within the DUT to the capture time of photons. Lock-in techniques in accordance with this disclosure can enhance the timing fidelity of this by improvement of the signal-to-noise ration (SNR) and also allowing the phase of the signal to be measured as well as the intensity; this allows underlying, weak thermal spots to be localized. There is in general a limit to the localization accuracy in terms of depth resolution of this technique which is partially due to the limits of the phase-dependent detector; the maximum speed at which the detector can be driven at determines the resolution for the phase measurements. By recording the arrival time of the thermal photons through timestamping and the generation of histogram 125, and then correlating each photon to the start of the test loop or the relevant gating signal, a much higher timing resolution can be provided that gives the capability of more accurately predicting the depth of the feature that is generating the heat. The ability to change the start time is also a feature of these detectors; for time integrated detection the detector is 'always on' and so there is not the option to detect over subsections of the test loop. For the gated detectors described above, a further operation is that the detector can be driven to only detect signals over a small portion of the test loop, with a movable or "sliding time" window. This can have a useful function if only a part of the test loop shows a failure and the user wants to focus only there in the time domain. It may not be possible to modify the test program to only exercise the device over this range but the detector may be gated appropriately.

Returning to FIG. 1, lock-in circuit 130 may also generate output images 155 and 160. Image 155 could, for example, represent amplitude data related to a location (e.g., an x-axis and y-axis location) of a defect within DUT 150's boundaries (e.g., 0° image). Image 160 could, for example, represent phase data related to a depth (e.g., along the z-axis) of a defect within DUT 150 (e.g., −90° quadrature image). In another embodiment, imaging device 105 may perform some or all of the functions identified for high-speed counter circuit 120.

Operation of LIT system 100 is in sharp contrast with prior art systems that rely on arrays of, for example, Indium antimonide (InSb) or similar photodiodes operating in integration mode to directly yield thermograms or images (see above). In these systems, photons are neither individually identified or processed. Instead, the generated frames represent an averaging of photons received during the integration period. Time integrated imaging has its own application space, but time-resolved detection (as disclosed herein) enables a wider range of applications.

Figure 3:
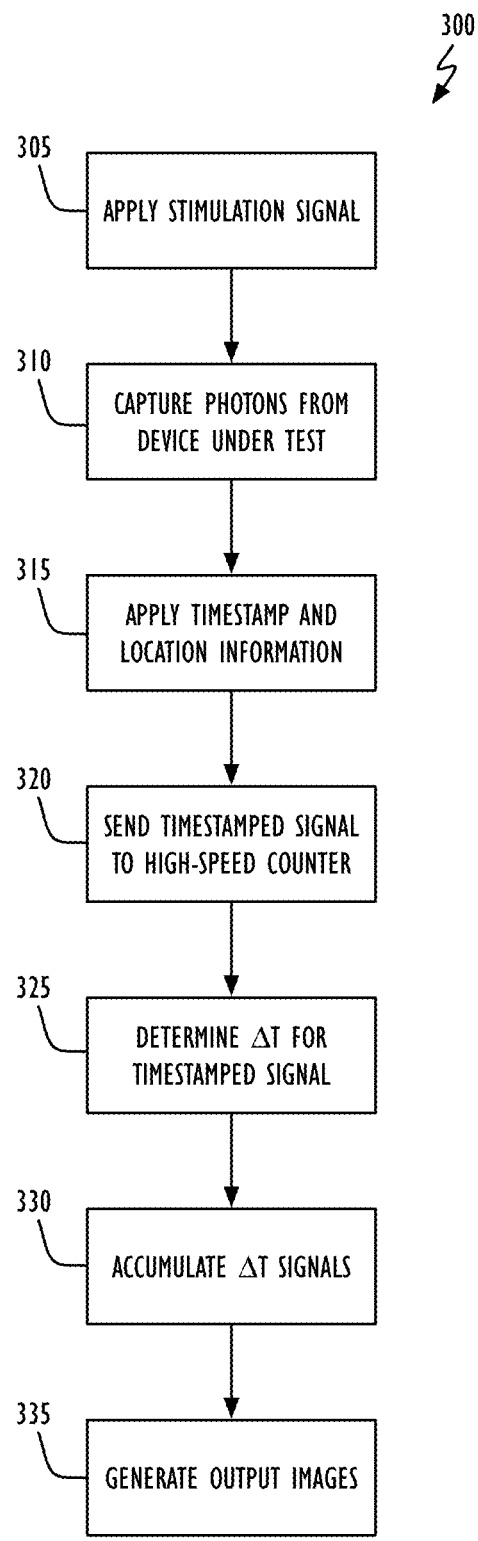
FIG. 3 shows, in flowchart form, a lock-in thermography operation in accordance with one or more embodiments.

Referring to FIG. 3, LIT operation 300 in accordance with one or more embodiments may begin when a stimulation (i.e., power) signal is applied to a device under test (block 305). In some embodiments, the stimulation frequency may also coincidently be applied to a lock-in device and/or a high-speed counter in accordance with this disclosure. Photons resulting from the stimulation may then be captured (block 310). In one embodiment, the photons may be thermal photons. In another embodiment, the photons wavelengths' may be in the approximately 2 to 5 micrometer range. In still another embodiment, the photons may have any wavelength appropriate to the stimulation signal and its operation on the device under test. In one embodiment, the photon detector may include a number of single low-noise photon detectors operating in a Geiger mode; e.g., an 8×8 or 64×64 array of photon detectors. By way of example, avalanche photodiodes, nanowire detectors, and superconducting single-photon detectors may be used to capture photons from the device under test. On reception, each photon may be associated with a timestamp representing the time the particular photon was detected and the detector's x-y position (block 315). Signals indicative of the time each photon was detected may then be sent to a high-speed counter (block 320). In accordance with this disclosure, a high-speed counter may use each photon's timestamp information and the stimulation signal to determine the time difference (ΔT) between when the device under test was stimulated and when the photon was detected (block 325). In one embodiment, the ΔT values may be binned or collected over a specified time to generate histograms indicative of the time spread over which photons are received for a given excitation cycle (block 330). That is, actions in accordance with blocks 310-325 may be repeated a number of times during repeated application of the excitation signal. By way of example, ΔT values may be used to identify a depth within the device under test from which a hot-spot that gave rise to the captured photon originated. If the device under test is a circuit board, integrated circuit, or a stacked die geometry for example, this information may be used to identify a layer within the device at which a malfunction can be found. With the collected ΔT information (e.g., histograms), amplitude and/or quadrature or phase images may be generated (block 335). As noted above, amplitude image data may be used to identify a x-axis/y-axis location within the device's boundaries and phase image data may be used to identify a z-axis location within the device.

Figure 4:
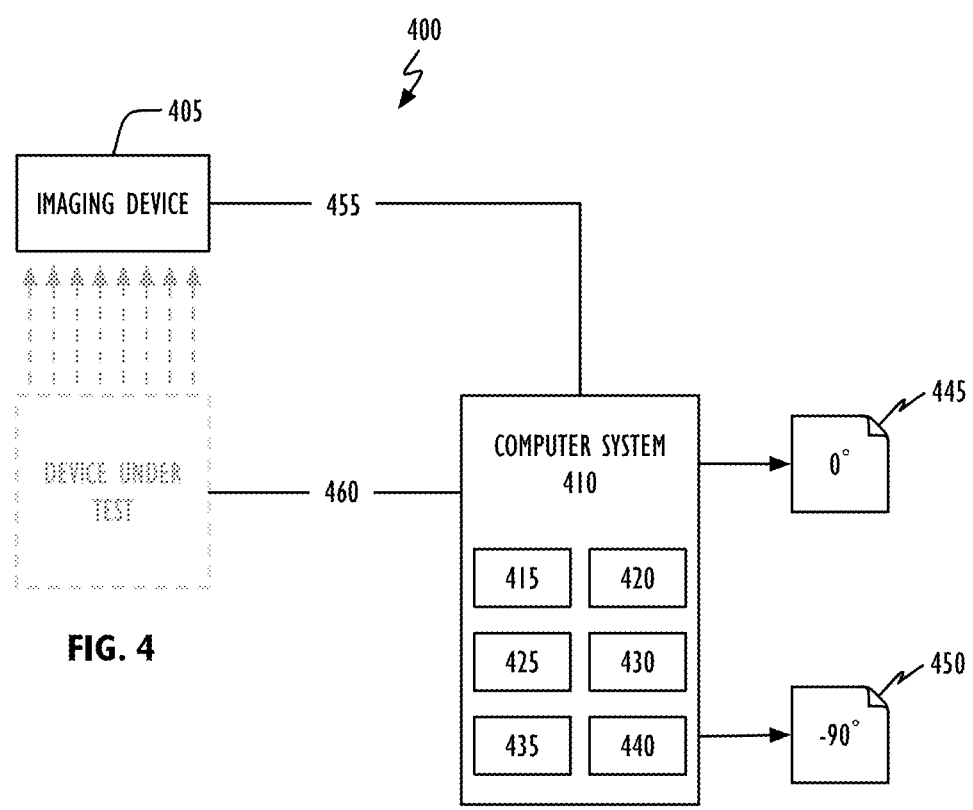
FIG. 4 shows, in block diagram form, a computer system in accordance with one or more embodiments.

Referring to FIG. 4, LIT system 400 in accordance with this disclosure may be embodied in imaging device 405 and computer system 410 (e.g., a general purpose computer system such as an engineering workstation, a desktop, laptop, notebook or tablet computer system). Computer system 410 can be contained in single housing or spatially distributed between two or more different locations. Computer system 410 may include one or more processors 415, memory 420, one or more storage devices 425, graphics hardware 430, image capture module 435, and communication interface 440.

Processor module or circuit 415 may include one or more processing units each of which may include at least one central processing unit (CPU) and zero or more graphics processing units (GPUs); each of which in turn may include one or more processing cores. Each processing unit may be based on reduced instruction-set computer (RISC) or complex instruction-set computer (CISC) architectures or any other suitable architecture. Processor module 415 may be a system-on-chip, an encapsulated collection of integrated circuits (ICs), or a collection of ICs affixed to one or more substrates. Memory 420 may include one or more different types of media (typically solid-state, but not necessarily so) used by processor 415, graphics hardware 430, image capture module 435, and communication interface 440. For example, memory 420 may include memory cache, read-only memory (ROM), and/or random access memory (RAM). Storage 425 may include one more non-transitory storage mediums including, for example, magnetic disks (fixed, floppy, and removable) and tape, optical media such as CD-ROMs and digital video disks (DVDs), and semiconductor memory devices such as Electrically Programmable Read-Only Memory (EPROM), and Electrically Erasable Programmable Read-Only Memory (EEPROM). Memory 420 and storage 425 may be used to retain media (e.g., audio, image and video files), preference information, device profile information, computer program instructions or code organized into one or more modules and written in any desired computer programming languages, and any other suitable data. When executed by processor(s) 415 and/or graphics hardware 430 and/or functional elements within image capture module 435 such computer program code may implement one or more of the methods described herein. Graphics hardware module or circuit 430 may be special purpose computational hardware for processing thermal image data obtained from imaging device 405 and/or assisting processor 415 perform computational tasks (e.g., the generation of histograms 125 and amplitude and phase images 445 and 450 respectively). In one embodiment, graphics hardware 430 may include one or more GPUs, and/or one or more programmable GPUs and each such unit may include one or more processing cores. Communication interface 440 may be used to connect computer system 410 to imaging device 405 via pathway 455, to a device under test (shown in shadow) via pathway 460, and to one or more networks (not shown). Illustrative networks include, but are not limited to, a local network such as a Universal Serial Bus (USB) network, a high-speed serial network, an organization's local area network, and a wide area network such as the Internet. Communication interface 440 may use any suitable technology (e.g., wired or wireless) and protocol (e.g., Transmission Control Protocol (TCP), Internet Protocol (IP), User Datagram Protocol (UDP), Internet Control Message Protocol (ICMP), Hypertext Transfer Protocol (HTTP), Post Office Protocol (POP), File Transfer Protocol (FTP), and Internet Message Access Protocol (IMAP)).

It is to be understood that the above description is intended to be illustrative, and not restrictive. The material has been presented to enable any person skilled in the art to make and use the disclosed subject matter as claimed and is provided in the context of particular embodiments, variations of which will be readily apparent to those skilled in the art (e.g., some of the disclosed embodiments may be used in combination with each other). For example, high-speed counter and lock-in circuits (e.g., elements 120 and 130 in FIG. 1) may be incorporated into a single device. Similarly, high-speed counter 120 could be incorporated within imaging device 105. Further, FIG. 3 shows a flowchart illustrating LIT operation in accordance with the disclosed embodiments. In one or more embodiments, one or more of the disclosed steps may be omitted, repeated, and/or performed in a different order than that described herein. Accordingly, the specific arrangement of steps or actions shown in FIG. 3 should not be construed as limiting the scope of the disclosed subject matter. The scope of the invention therefore should be determined with reference to the appended claims, along with the full scope of equivalents to which such claims are entitled. In the appended claims, the terms "including" and "in which" are used as the plain-English equivalents of the respective terms "comprising" and "wherein."

The invention claimed is:

1. A method comprising:
    applying an electrical test signal to a device under test, wherein the electrical test signal comprises a plurality of periods;
    detecting individual photons emitted from the device under test in response to the application of the electrical test signal, wherein the detected individual photons comprise thermal photons;
    for at least some of the detected individual thermal photons, determining time differences between times the individual thermal photons are detected and a time associated with at least one period of the electrical test signal; and
    generating an image based on the time differences between times the individual thermal photons are detected and the time associated with at least one period of the electrical test signal.

2. The method of claim 1, wherein the electrical test signal comprises a sinusoidal electrical test signal.

3. The method of claim 1, further comprising measuring phase differences for at least some of the detected individual thermal photons with respect to the electrical test signal.

4. The method of claim 1, wherein the individual thermal photons are detected using a plurality of single photodiodes operating in a Geiger mode.

5. The method of claim 4, wherein the photodiodes comprise superconducting single-photon detectors.

6. The method of claim 1, wherein:
    the electrical test signal comprises a square wave, wherein the time associated with at least one period of the electrical test signal corresponds to at least one rising edge of the square wave in the at least one period.

7. The method of claim 1, further comprising determining at least one histogram for each of a plurality of periods of the electrical test signal, each histogram corresponding to a distribution of the determined time differences in a respective period of the electrical test signal.

8. A system, comprising:
    an excitation source configured to supply an electrical test signal to a device;
    a defect detection circuit configured to:
        detect individual photons emitted from the device in response to the electrical test signal from the excitation source, wherein the photons comprise thermal photons, and
        for at least some of the detected individual thermal photons, determine time differences between times the individual thermal photons are detected and a time associated with at least one period of the electrical test signal; and
    an output module configured to generate an image based on the time differences between the times the individual thermal photons emitted from the device are detected and the time associated with at least one period of the electrical test signal.

9. The system of claim 8, wherein the electrical test signal comprises a sinusoidal electrical test signal.

10. The system of claim 8, wherein the defect detection circuit is further configured to establish phase differences for at least some of the detected individual thermal photons based on the electrical test signal.

11. The system of claim 8, wherein the defect detection circuit comprises a plurality of single photodiodes operating in a Geiger mode.

12. The system of claim 11, wherein the photodiodes comprise superconducting single-photon detectors.

13. The system of claim 8, wherein:
    the electrical test signal comprises a square wave, wherein the time associated with at least one period of the electrical test signal corresponds to a rising edge of the square wave in the at least one period.

14. The system of claim 8, wherein the defect detection circuit is further configured to generate at least one histogram for each of a plurality of periods of the electrical test signal, each histogram associated with a plurality of determined time differences in a respective period of the plurality of periods.

15. The system of claim 8, further comprising a lock-in circuit configured to:
    receive an output from the defect detection circuit;
    receive a reference signal having a frequency corresponding to a frequency of the electrical test signal; and
    generate a synchronized input to the output module, wherein the synchronized input is synchronized to the reference frequency.

16. The system of claim 15, wherein the output from the defect detection unit comprises a plurality of histograms, each histogram corresponding to a distribution of a plurality of time differences determined in a respective period of the electrical test signal.

17. The system of claim 8, wherein the image comprises a phase image associated with phase differences for at least some of the detected individual thermal photons with respect to the electrical test signal, d.

18. The method of claim 1, wherein the image comprises a phase image based on phase differences for at least some of the detected individual thermal photons with respect to the electrical test signal, wherein the phase image is indicative of a depth of a defect within the device under test.

19. The method of claim 1, wherein the detected individual thermal photons have wavelengths between 2 μm and 5 μm.

20. The system of claim 8, wherein the detected individual thermal photons have wavelengths between 2 μm and 5 μm.

21. The method of claim 1, wherein the individual thermal photons are detected with a photodiode array operating in a Geiger mode.

22. The method of claim 1, wherein the individual thermal photons are detected using at least one photodetector operating in a Geiger mode.

23. The system of claim 8, wherein the defect detection circuit comprises at least one photodetector operating in a Geiger mode.

24. The system of claim 11, wherein the plurality of single photodiodes operating in a Geiger mode comprises a photodiode array.

\* \* \* \* \*